US010867659B2

(12) United States Patent
Lee et al.

(10) Patent No.: US 10,867,659 B2
(45) Date of Patent: *Dec. 15, 2020

(54) ADDRESS COUNTING CIRCUIT, MEMORY DEVICE AND OPERATING METHOD THEREOF

(71) Applicant: SK hynix Inc., Gyeonggi-do (KR)

(72) Inventors: Jae-Seung Lee, Gyeonggi-do (KR); Hae-Rang Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/422,629

(22) Filed: May 24, 2019

(65) Prior Publication Data

US 2019/0279703 A1  Sep. 12, 2019

Related U.S. Application Data

(62) Division of application No. 16/406,849, filed on May 8, 2019, which is a division of application No. 15/623,448, filed on Jun. 15, 2017, now abandoned.

(30) Foreign Application Priority Data

Oct. 31, 2016  (KR) .......................... 10-2016-0143171

(51) Int. Cl.
*G11C 11/408*  (2006.01)
*G11C 29/00*  (2006.01)
*G11C 29/20*  (2006.01)
*G11C 29/36*  (2006.01)
*G11C 29/50*  (2006.01)
*G11C 11/406*  (2006.01)

(52) U.S. Cl.
CPC .......... *G11C 11/408* (2013.01); *G11C 11/406* (2013.01); *G11C 29/00* (2013.01); *G11C 29/20* (2013.01); *G11C 29/36* (2013.01); *G11C 29/50* (2013.01)

(58) Field of Classification Search
CPC ........................... G11C 11/408; G11C 11/406
USPC ........................................................ 365/222
See application file for complete search history.

(56) References Cited

U.S. PATENT DOCUMENTS

| 7,728,642 | B1 | 6/2010 | O'Dwyer | |
|---|---|---|---|---|
| 7,821,861 | B2* | 10/2010 | Lin ................... | G11C 11/40603 365/189.12 |
| 2002/0145916 | A1* | 10/2002 | Chevallier ......... | G11C 16/3431 365/185.33 |
| 2004/0165465 | A1* | 8/2004 | Kashiwazaki ........ | G11C 11/406 365/222 |
| 2005/0249009 | A1* | 11/2005 | Shieh ................... | G11C 11/406 365/222 |

(Continued)

FOREIGN PATENT DOCUMENTS

| CN | 1832033 A | 9/2006 |
|---|---|---|
| CN | 105614639 A | 7/2016 |

OTHER PUBLICATIONS

Office Action issued by the Chinese Patent Office dated Sep. 24, 2020.

*Primary Examiner* — Muna A Techane
(74) *Attorney, Agent, or Firm* — IP & T Group LLP

(57) ABSTRACT

An address counting circuit includes an address counter suitable for counting an address in response to a counting signal; and a counting control block suitable for controlling the address counter to skip the address of at least one predetermined value.

6 Claims, 13 Drawing Sheets

(56) References Cited

U.S. PATENT DOCUMENTS

2006/0256637 A1* 11/2006 Takahashi ............. G11C 29/44
                                                     365/222
2007/0030746 A1*  2/2007 Best ..................... G11C 11/406
                                                     365/222
2007/0033338 A1   2/2007 Tsern
2008/0253212 A1* 10/2008 Iida ..................... G11C 11/406
                                                     365/222

* cited by examiner

ADDRESS COUNTING CIRCUIT, MEMORY DEVICE AND OPERATING METHOD THEREOF

CROSS-REFERENCE TO RELATED APPLICATION

This application is a division of U.S. patent application Ser. No. 16/406,849 filed on May 8, 2019, which is a division of U.S. patent application Ser. No. 15/623,448 filed on Jun. 15, 2017, which claims priority of Korean Patent Application No. 10-2016-0143171, filed on Oct. 31, 2016. The disclosure of each of the foregoing applications is incorporated herein by reference in its entirety.

TECHNICAL FIELD

Exemplary embodiments relate to an address counting circuit, a memory device and an operating method thereof.

DISCUSSION OF THE RELATED ART

In general, a memory cell of a semiconductor memory device such as a dynamic random access memory (DRAM) is constructed by a transistor serving as a switch and a capacitor storing charges (i.e., data). Data is identified as 'high' (logic 1) or 'low' (logic 0) depending on whether charges are present in the capacitor of the memory cell, that is, whether the voltage across the terminals of the capacitor is high or low.

In principle, storage of data does not consume power because the storage of data is implemented in such a manner that charges are accumulated in a capacitor. However, data may be lost because an initial amount of charges stored in the capacitor may vanish due to a leakage current attributable to the PN coupling of a metal-oxide-semiconductor (MOS) transistor, or the like. In order to prevent this, data in a memory cell should be read before the data is lost, and a normal amount of charges should be recharged based on a read information. Storage of data may be retained only when such an operation is periodically repeated. Such a process for recharging cell charges is referred to as a refresh operation.

The refresh operation in a memory device is performed each time a refresh command is received from a memory controller. The memory controller transmits the refresh command to the memory device at a predetermined time interval which takes into consideration the data retention time of the memory device and the total number of memory cells of the memory device. For example, if the data retention time of a memory device is 64 ms and all the memory cells in the memory device may be refreshed when a refresh command is received 8000 times, the memory controller transmits the refresh command to the memory device 8000 times for a period of 64 ms.

In a test process of a memory device, if the individual data retention times of some of the memory cells included in the memory device do not exceed a predetermined reference time, the corresponding memory device is handled as a fail. The memory device handled as a fail in this way should be discarded.

If all of memory devices including memory cells having data retention times not exceeding a reference time (that is, weak cells) are handled as fails, the yield of the memory devices may decrease. Furthermore, although a memory device has passed a test, an error may still occur if a weak cell is induced due to a posterior factor.

Moreover, since ultra-high integration requires at least several tens of millions of cells being integrated in a single chip, the probability of a weak cell to exist increases even through manufacturing processes continue to improve. If a test is not precisely carried out for such a weak cell, it may be difficult to secure reliability of a semiconductor memory device. Therefore, various schemes and methods for detecting a weak cell are being researched.

SUMMARY

Various embodiments are directed to an address counting circuit, a memory device which can effectively detect a weak cell by using the address counting circuit, and a method for operating a memory device.

In an embodiment, an address counting circuit may include: an address counter suitable for counting an address in response to a counting signal; and a counting control block suitable for controlling the address counter to skip the address of at least one predetermined value.

In an embodiment, a memory device may include: a cell array including a plurality of memory cells; a refresh counter suitable for counting a refresh address in response to a refresh command, by skipping the refresh address of at least one predetermined value; and a control block suitable for controlling at least one memory cell corresponding to the refresh address among the plurality of memory cells, to be refreshed in response to the refresh command.

In an embodiment, a memory device may include: a cell array including a plurality of memory cells; a refresh counter suitable for counting a refresh address in response to a refresh command; a refresh signal generation block suitable for activating an internal refresh signal in response to the refresh command, and not activating the internal refresh signal in the case where the refresh address has at least one predetermined value; and a control block suitable for controlling at least one memory cell corresponding to the refresh address among the plurality of memory cells, to be refreshed in response to the internal refresh signal.

In an embodiment, a method for operating a memory device including a plurality of memory cells may include: counting a refresh address in response to a refresh command, by skipping the refresh address of at least one predetermined value; refreshing at least one memory cell corresponding to the refresh address among the plurality of memory cells, in response to the refresh command; and changing the predetermined value when a refresh cycle is performed at least once.

BRIEF DESCRIPTION OF THE DRAWINGS

The above and other features and advantages of the present invention will become more apparent to those skilled in the art to which the present invention pertains by the following detailed description with reference to the attached drawings in which.

DETAILED DESCRIPTION

Figure 1:
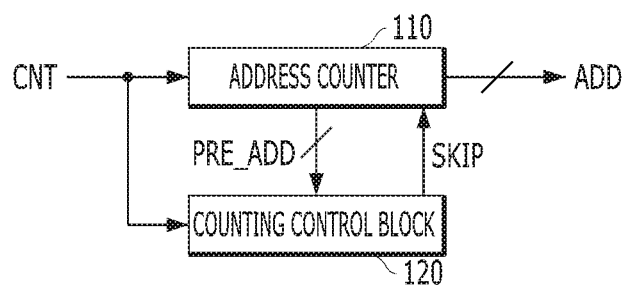
FIG. 1 is a diagram illustrating an address counting circuit in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram illustrating an address counting circuit in accordance with an embodiment of the present invention.

Referring to FIG. 1, the address counting circuit may include an address counter 110 and a counting control block 120.

The address counter 110 may perform counting in response to a counting signal CNT, and generate an address ADD by using a result thereof. The address counter 110 may repeatedly count the address ADD from an initial value to an end value. If the counting signal CNT is activated in the state in which the address ADD has the end value, the address counter 110 may change the address ADD to the initial value and count again the address ADD from the initial value. A period in which the address ADD is counted 1 time from the initial value to the end value may be defined as 1 counting cycle. For example, in the case where the address ADD is a 6-bit information, the address counter 110 may perform counting in response to the counting signal CNT, and repeatedly count the value of the address ADD from 000000 to 111111.

The counting control block 120 may control the address counter 110 using a skip signal SKIP such that the value of the address ADD skips at least one predetermined value. That is to say, the address counter 110 may be controlled by the skip signal SKIP of the counting control block 120 to skip at least one predetermined value among values which the address ADD may have. For example, in the case where the counting control block 120 controls the value of the address ADD to skip predetermined values 100000 to 100111, the address counter 110 may count the address ADD from 000000 to 011111, skip a period in which the address ADD is 100000 to 100111 based on the skip signal SKIP and count the address ADD from 101000 to 111111. Hereafter, a period in which the value of the address ADD is skipped is referred to as a 'skip period.'

The address counter 110 may retain the value of the address ADD as a constant value in the skip period. In the above-described example, the address counter 110 may retain the value of the address ADD as 011111 (i.e., the value immediately before entering the skip period) in the skip period. The predetermined values may represent the values of the address ADD in which some bits among the plurality of bits included in the address ADD have a preset value. In the above-described example, the predetermined values may be defined as the values of the address ADD in which upper 3 bits of the address ADD have the value of 100, that is, the address ADD have the value of 100XXX (X is 0 or 1).

The counting control block 120 may change at least one bit of the preset value when the counting cycle of the address counter 110 is ended at least 1 time. For example, the preset value may be 000XXX in a first counting cycle, may be changed to 001XXX in a second counting cycle, may then be changed to 010XXX in a third counting cycle and may finally be changed to 111XXX in a final counting cycle.

Table 1 represents a preset value, a period in which the value of the address ADD is counted (i.e., a counting period) and a skip period depending on a counting cycle in the above-described example in the case where the counting control block 120 changes at least one bit of the preset value each time the counting cycle is ended 1 time.

TABLE 1

| Counting cycle | Preset value | Counting period | Skip period |
| --- | --- | --- | --- |
| 1 | 000XXX | 001000-111111 | 000000-000111 |
| 2 | 001XXX | 000000-000111, 010000-111111 | 001000-001111 |
| 3 | 010XXX | 000000-001111, 011000-111111 | 010000-010111 |
| 4 | 011XXX | 000000-010111, 100000-111111 | 011000-011111 |
| 5 | 100XXX | 000000-011111, 101000-111111 | 100000-100111 |
| 6 | 101XXX | 000000-100111, 110000-111111 | 101000-101111 |
| 7 | 110XXX | 000000-101111, 111000-111111 | 110000-110111 |
| 8 | 111XXX | 000000-110111 | 111000-111111 |

Table 2 represents a preset value, a period in which the value of the address ADD is counted (i.e., a counting period) and a skip period depending on a counting cycle in the above-described example in the case where the counting control block 120 changes at least one bit of the preset value each time the counting cycle is ended two times.

The output value of the address counter 110 in the first and second counting cycles may be 111111, the output value of the address counter 110 in the third and fourth counting cycles may be 000111, the output value of the address counter 110 in the fifth and sixth counting cycles may be 001111, the output value of the address counter 110 in the seventh and eighth counting cycles may be 010111, the output value of the address counter 110 in the ninth and tenth counting cycles may be 011111, the output value of the address counter 110 in the eleventh and twelfth counting cycles may be 100111, the output value of the address counter 110 in the thirteenth and fourteenth counting cycles may be 101111, and the output value of the address counter 110 in the fifteenth and sixteenth counting cycles may be 110111.

TABLE 2

| Counting cycle | Preset value | Counting period | Skip period |
| --- | --- | --- | --- |
| 1 | 000XXX | 001000-111111 | 000000-000111 |
| 2 | 000XXX | 001000-111111 | 000000-000111 |
| 3 | 001XXX | 000000-000111, 010000-111111 | 001000-001111 |
| 4 | 001XXX | 000000-000111, 010000-111111 | 001000-001111 |
| 5 | 010XXX | 000000-001111, 011000-111111 | 010000-010111 |
| 6 | 010XXX | 000000-001111, 011000-111111 | 010000-010111 |
| 7 | 011XXX | 000000-010111, 100000-111111 | 011000-011111 |
| 8 | 011XXX | 000000-010111, 100000-111111 | 011000-011111 |
| 9 | 100XXX | 000000-011111, 101000-111111 | 100000-100111 |
| 10 | 100XXX | 000000-011111, 101000-111111 | 100000-100111 |
| 11 | 101XXX | 000000-100111, 110000-111111 | 101000-101111 |
| 12 | 101XXX | 000000-100111, 110000-111111 | 101000-101111 |
| 13 | 110XXX | 000000-101111, 111000-111111 | 110000-110111 |
| 14 | 110XXX | 000000-101111, 111000-111111 | 110000-110111 |
| 15 | 111XXX | 000000-110111 | 111000-111111 |
| 16 | 111XXX | 000000-110111 | 111000-111111 |

A preset value and the number of counting cycles needed to change the preset value may be varied depending on a design. In the above-described example, the address counter 110 may count the address ADD from 000000 to 111111, and the values from 000000 to 111111 may be divided into first to eighth periods. Table 1 represents operations of skipping first to eighth periods in first to eighth counting cycles when the first period is 000000 to 000111, the second period is 001000 to 001111, the third period is 010000 to 010111, the fourth period is 011000 to 011111, the fifth period is 100000 to 100111, the sixth period is 101000 to 101111, the seventh period is 110000 to 110111 and the eighth period is 111000 to 111111.

Figure 2:
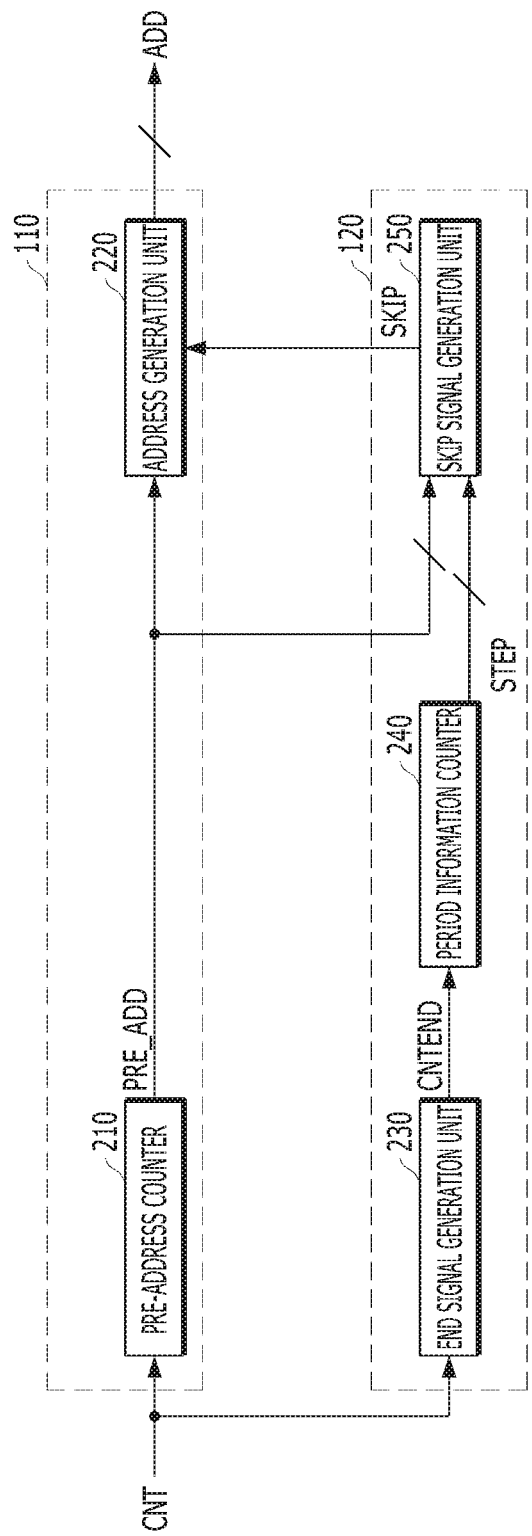
FIG. 2 is a diagram illustrating exemplary configurations of an address counter and a counting control block shown in FIG. 1.

FIG. 2 is a diagram illustrating exemplary configurations of the address counter 110 and the counting control block 120 shown in FIG. 1.

Referring to FIG. 2, the address counter 110 may include a pre-address counter 210 and an address generation unit 220. The counting control block 120 may include an end signal generation unit 230, a period information counter 240 and a skip signal generation unit 250.

The pre-address counter 210 may perform counting in response to the counting signal CNT, and generate a pre-address PRE_ADD by using a result thereof. The pre-address counter 210 may repeatedly count the pre-address PRE_ADD from an initial value to an end value. If the counting signal CNT is activated in the state in which the pre-address PRE_ADD has the end value, the pre-address counter 210 may change the pre-address PRE_ADD to the initial value and count again the pre-address PRE_ADD from the initial value. A period in which the pre-address PRE_ADD is counted 1 time from the initial value to the end value may be defined as 1 counting cycle. For example, in the case where the pre-address PRE_ADD is a 6-bit information, the pre-address counter 210 may repeatedly count the value of the pre-address PRE_ADD from 000000 to 111111.

The plurality of values of the pre-address PRE_ADD from the initial value to the end value may be divided into first to $m^{th}$ (where m is a natural number) periods. The values of the pre-address PRE_ADD included in the same period may be the same in the values of one or more preset bits among the plurality of bits included in the pre-address PRE_ADD. For example, the plurality of values 000000 to 111111 may be divided into first to eighth periods. The values of the pre-address PRE_ADD included in the same period may be the same in upper 3 bits among the 6 bits included in the pre-address PRE_ADD. In the case where 000000 to 111111 are divided into 8 periods, the first to eighth periods may be 000000 to 000111, 001000 to 001111, 010000 to 010111, 011000 to 011111, 100000 to 100111, 101000 to 101111, 110000 to 110111, and 111000 to 111111, respectively.

The address generation block 220 may transfer the pre-address PRE_ADD as the address ADD. In the case where a skip signal SKIP is activated, the address generation block 220 may not transfer the pre-address PRE_ADD as the address ADD and may retain a value immediately before the skip signal SKIP is activated.

The end signal generation unit 230 may activate an end signal CNTEND when the counting cycle of the pre-address counter 210 is ended at least 1 time. For example, the end signal generation unit 230 may activate the end signal CNTEND each time the counting cycle is ended 1 time. In the case where the pre-address PRE_ADD is 6 bits, since the counting cycle is ended 1 time when the counting signal CNT is activated 64 times, the end signal generation unit 230 may activate the end signal CNTEND each time the counting signal CNT is activated 64 times.

For another example, the end signal generation unit 230 may activate the end signal CNTEND each time the counting cycle is ended 2 times. In the case where the pre-address PRE_ADD is 6 bits, since the counting cycle is ended 2 times when the counting signal CNT is activated 128 times, the end signal generation unit 230 may activate the end signal CNTEND each time the counting signal CNT is activated 128 times. The end signal generation unit 230 may be designed to activate the end signal CNTEND when the counting signal CNT is activated by a predetermined number of times in consideration of the bit number of the pre-address PRE_ADD and the number of counting cycles. For reference, the end signal CNTEND may be a pulse signal which is activated for a predetermined period.

The period information counter 240 may activate a period information STEP when the end signal CNTEND is activated at least 1 time. The period information STEP may be an information which has a predetermined number of bits. For example, the period information STEP may be a 3-bit signal and have a value from 000 to 111. In this case, the period information counter 240 may output 000 as the initial value of the period information STEP, and count the period information STEP each time the end signal CNTEND is activated at least 1 time. In detail, the period information counter 240 may increase the period information STEP from 000 to 111 by 1 each time the end signal CNTEND is activated at least 1 time. The values 000 to 111 of the period information STEP may correspond to the first to eighth periods, respectively. The number of times by which the end signal CNTEND should be activated for the period information counter 240 to count the period information STEP may be set variously to 1, 2, or more times depending on a design.

The skip signal generation unit 250 may compare one or more preset bits among the plurality of bits included in the period information STEP and the pre-address PRE_ADD, and activate the skip signal SKIP when the values thereof are the same. For example, the skip signal generation unit 250 may compare upper 3 bits among the 6 bits included in the pre-address PRE_ADD and the 3 bits included in the period information STEP, and activate the skip signal SKIP when the values of the corresponding bits are the same. Table 3 represents a period in which the skip signal SKIP is activated, depending on the value of the period information STEP and the value of the pre-address PRE_ADD.

TABLE 3

| Value of period information (STEP) | Values of pre-address (PRE_ADD) for which skip signal (SKIP) is activated |
|---|---|
| 000 | 000000-000111 |
| 001 | 001000-001111 |
| 010 | 010000-010111 |
| 011 | 011000-011111 |
| 100 | 100000-100111 |
| 101 | 101000-101111 |
| 110 | 110000-110111 |
| 111 | 111000-111111 |

If the skip signal SKIP is activated, since the address generation unit 220 does not transfer the pre-address PRE_ADD as the address ADD and retains a value before the skip signal SKIP is activated, the address ADD is not counted as values corresponding to the values of the pre-address PRE_ADD of a period in which the skip signal SKIP is activated. In other words, values for which the pre-address PRE_ADD is counted in the period in which the skip signal SKIP is activated may be one or more predetermined values which are skipped by the address ADD.

Figure 3:
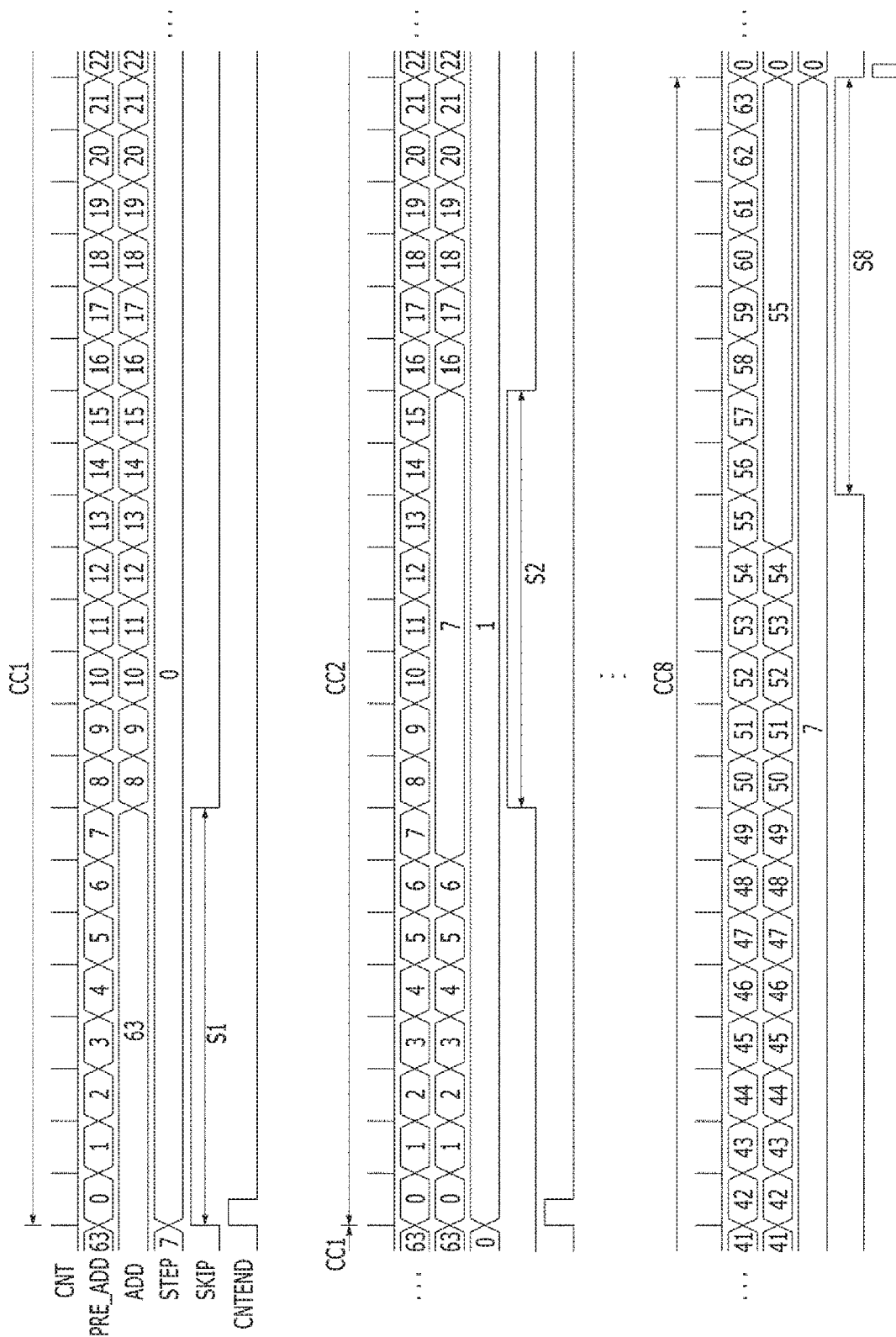
FIG. 3 is a diagram illustrating an operation of the address counting circuit shown in FIG. 1.

FIG. 3 is a diagram illustrating an exemplary operation of the address counting circuit shown in FIG. 1.

With reference to FIG. 3, descriptions will be made for the case in which each of the address ADD and the pre-address PRE_ADD is 6 bits, the period information STEP is 3 bits and a skip period is determined by comparing the period information STEP and the upper 3 bits of the pre-address PRE_ADD. The period information STEP may be counted each time 1 counting cycle is ended. Hereunder, the values 000000 to 111111 of the pre-address PRE_ADD and the address ADD may be represented as 0 to 63, and the values 000 to 111 of the upper 3 bits of the pre-address PRE_ADD and the period information STEP may be represented as 0 to 7.

Referring to FIG. 3, the pre-address PRE_ADD may be counted each time the counting signal CNT is activated. In a first counting cycle CC1, since the period information STEP has a value of 0, the skip signal SKIP may be activated in a period S1 in which the upper 3 bits of the pre-address PRE_ADD are 0 to 7 corresponding to 0. Therefore, in this period S1, the pre-address PRE_ADD is not transferred as the address ADD, and the value of the address ADD may be retained as 63 as the value of the pre-address PRE_ADD before entering the period S1. If the pre-address PRE_ADD becomes 8, the skip signal SKIP is deactivated. Thereafter, as the pre-address PRE_ADD is transferred as the address ADD, the pre-address PRE_ADD and the address ADD may have the same value.

TABLE 4

| Counting cycle | Value of period information (STEP) | Values of pre-address (PRE_ADD) for which skip signal (SKIP) is activated | Value of address (ADD) in skip period |
|---|---|---|---|
| Second counting cycle (CC2) | 1 (001) | 8-15 | 7 |
| Third counting cycle (CC3) | 2 (010) | 16-23 | 15 |
| Fourth counting cycle (CC4) | 3 (011) | 24-31 | 23 |
| Fifth counting cycle (CC5) | 4 (100) | 32-39 | 31 |
| Sixth counting cycle (CC6) | 5 (101) | 40-47 | 39 |
| Seventh counting cycle (CC7) | 6 (110) | 48-55 | 47 |
| Eighth counting cycle (CC8) | 7 (111) | 56-63 | 55 |

Table 4 explains the operation of the address counting circuit in second to eighth counting cycles CC2 to CC8. In the second to eighth counting cycles CC2 to CC8, since the period information STEP has values of 1 to 7, respectively, the skip signal SKIP may be activated in periods S2 to S8 in which the upper 3 bits of the pre-address PRE_ADD are '8 to 15' to '56 to 63' corresponding to 1 to 7, respectively. Therefore, in these corresponding periods S2 to S8, the pre-address PRE_ADD is not transferred as the address ADD, and the value of the address ADD may be retained as 7, 15, 23, 31, 39, 47 and 55 as the values of the pre-address PRE_ADD before entering the periods S2 to S8. In the other periods, as the pre-address PRE_ADD is transferred as the address ADD, the pre-address PRE_ADD and the address ADD may have the same value.

Figure 4:
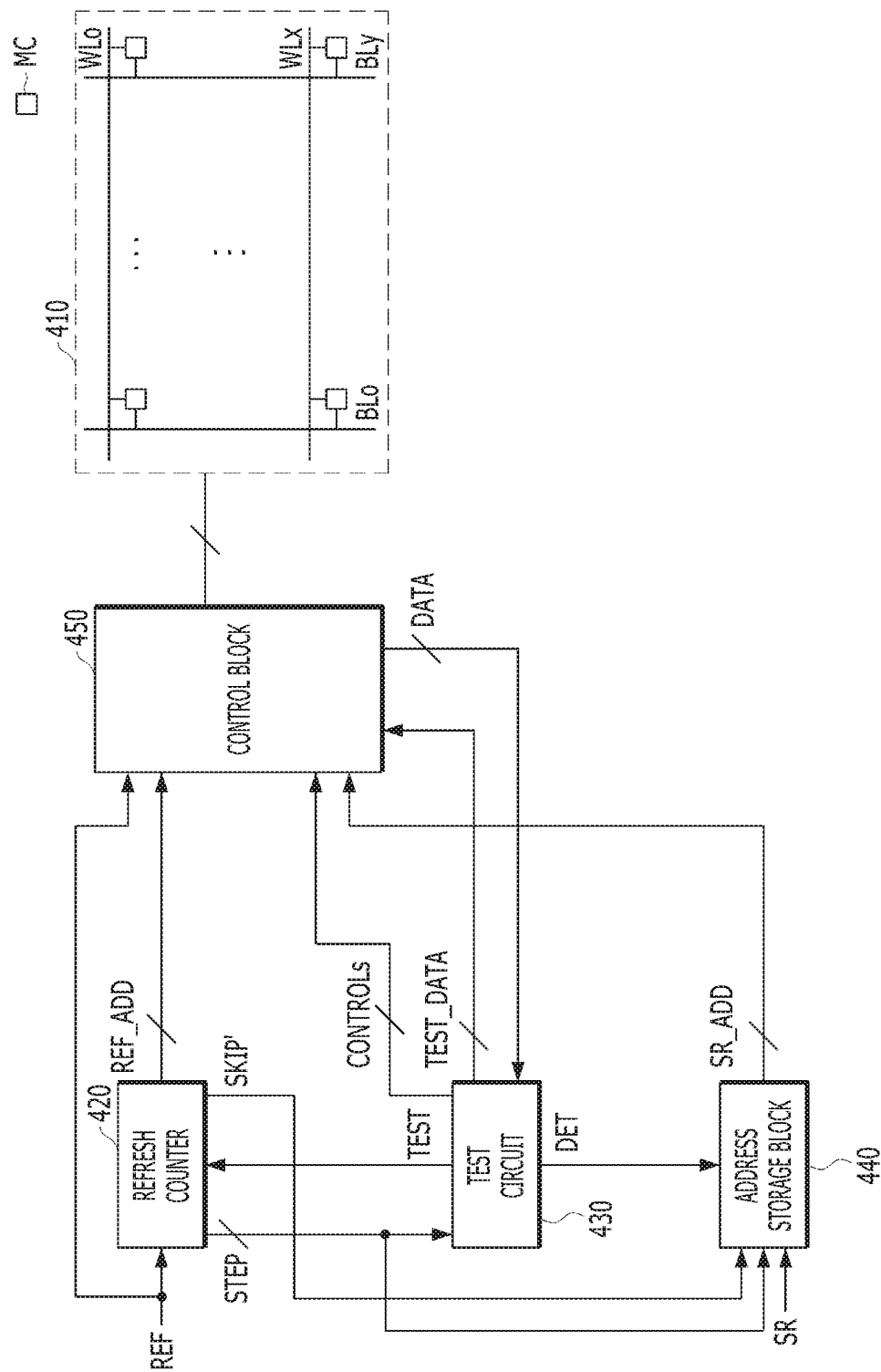
FIG. 4 is a diagram illustrating a memory device in accordance with an embodiment of the present invention.

FIG. 4 is a diagram illustrating a memory device in accordance with an embodiment of the present invention.

Referring to FIG. 4, the memory device may include a cell array 410, a refresh counter 420, a test circuit 430, an address storage block 440, and a control block 450.

The cell array 410 may include a plurality of word lines WL0 to WLx (where x is a natural number), a plurality of bit lines BL0 to BLy (where y is a natural number), and a plurality of memory cells MC coupled between the word lines WL0 to WLx and the bit lines BL0 to BLy. The numbers of word lines, bit lines and memory cells may be changed depending on a design.

The refresh counter 420 may count a refresh address REF_ADD in response to a refresh command REF, and allow the refresh address REF_ADD to skip at least one predetermined value in a test operation. Each of the values, which the refresh address REF_ADD as a multi-bit signal may have, may correspond to one word line among the plurality of word lines WL0 to WLx.

The plurality of word lines WL0 to WLx are refreshed sequentially. A refresh cycle includes refreshing all the word lines from the word line WL0 to the word line WLx once. In the case where the plurality of word lines WL0 to WLx and the values of the refresh address REF_ADD match 1:1, a cycle in which the refresh address REF_ADD is counted from an initial value to an end value (hereinafter, referred to as a counting cycle) may be the same as the refresh cycle.

When a test signal TEST is deactivated, the refresh counter 420 cannot perform a skip operation, and repeatedly counts the refresh address REF_ADD. When the test signal TEST is activated, the refresh counter 420 may repeatedly count the refresh address REF_ADD, and may skip at least one predetermined value in each refresh cycle.

Figure 5:
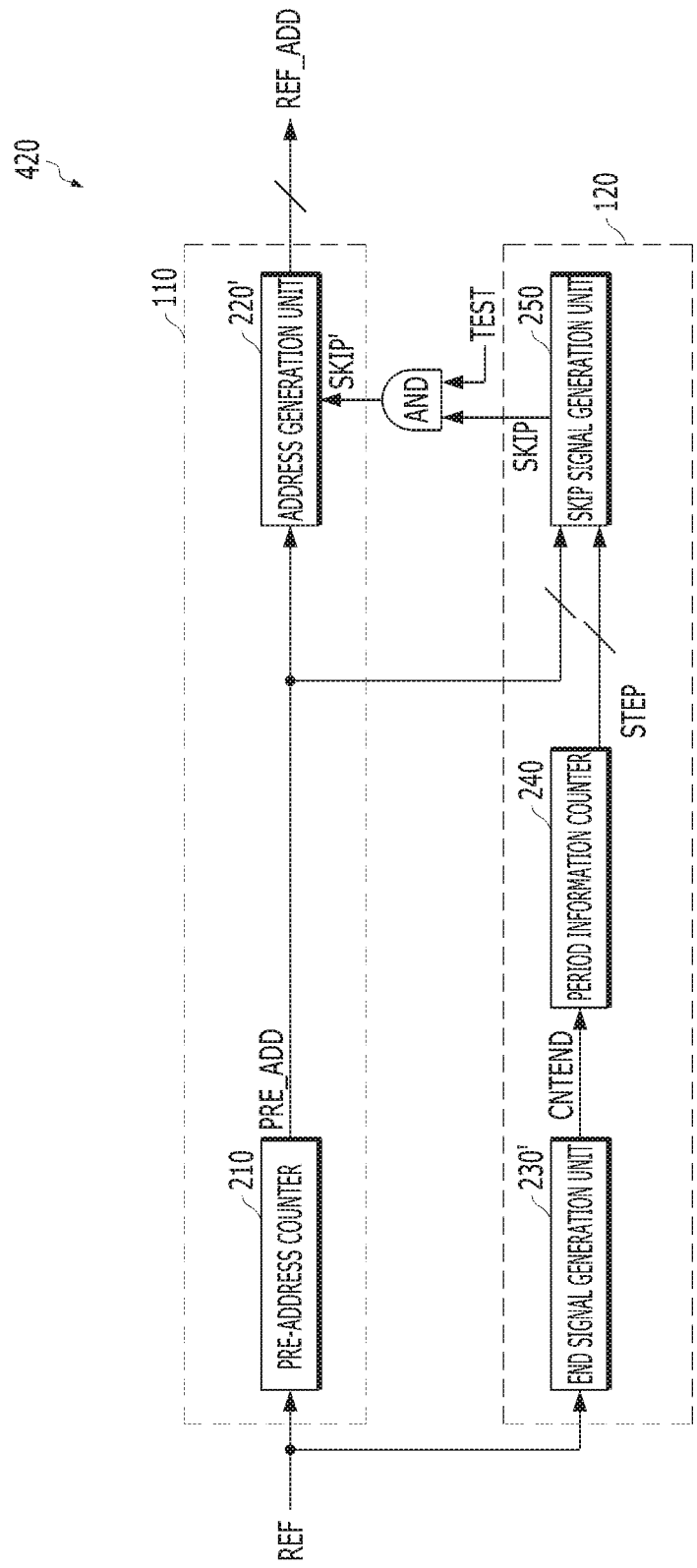
FIG. 5 is a diagram illustrating an exemplary configuration of a refresh counter shown in FIG. 4.

FIG. 5 is a diagram illustrating an exemplary configuration of the refresh counter 420 shown in FIG. 4.

Referring to FIG. 5, the refresh counter 420 may include the same configuration as the address counting circuit of FIG. 2. The refresh command REF may correspond to the counting signal CNT of FIG. 2. An address generation unit 220' of FIG. 5 may transfer a pre-address PRE_ADD as the refresh address REF_ADD or block the pre-address PRE_ADD from being transferred as the refresh address REF_ADD in response to a second skip signal SKIP' generated by combining a first skip signal SKIP and the test signal TEST. Thus, when the test signal TEST is deactivated, the refresh counter 420 may transfer the pre-address PRE_ADD as the refresh address REF_ADD regardless of the logic value of the first skip signal SKIP. When the test signal TEST is activated, the refresh counter 420 may transfer the pre-address PRE_ADD as the refresh address REF_ADD when the first skip signal SKIP is in a deactivated state and block the pre-address PRE_ADD from being transferred as the refresh address REF_ADD when the first skip signal SKIP is in an activated state. An end signal generation unit 230' of FIG. 5 may activate an end signal CNTEND when at least one refresh cycle has been ended.

The refresh counter 420 may change the at least one predetermined value when the refresh cycle is ended at least once. Therefore, the value of the refresh address REF_ADD to be skipped in a refresh cycle in the test operation may be changed. For example, in the case where the refresh address REF_ADD is a 6-bit multi-signal and the values of the refresh address REF_ADD are divided into 8 periods in the same manner as the address ADD described above with reference to FIG. 2, the refresh counter 420 may skip 000000 to 000111, 001000 to 001111, 010000 to 010111, 011000 to 011111, 100000 to 100111, 101000 to 101111, 110000 to 110111 and 111000 to 111111 in first to eighth refresh cycles, respectively, in the test operation. Also, the refresh counter 420 may output 111111, 000111, 001111, 010111, 011111, 100111, 101111 and 110111 in the skip periods of the first to eighth refresh cycles, respectively, in the test operation.

Referring again to FIG. 4, the test circuit 430 may compare the data stored in one or more memory cells corresponding to at least one predetermined value before a refresh cycle is performed at least once and the data stored in the one or more memory cells corresponding to the at least one predetermined value after a refresh cycle is performed at least once, and may detect the data retention time of the one or more memory cells. The test operation may be a test for detecting weak cells having data retention times shorter than a reference time, among the plurality of memory cells MC.

The test circuit 430 may activate the test signal TEST in the case of performing the test operation, and control test data TEST_DATA to be written in the memory cells MC (hereinafter, referred to as test cells) coupled to at least one word line corresponding to the refresh address REF_ADD to be skipped in a corresponding refresh cycle, before a next refresh command REF is applied. If a period information STEP is changed, the test circuit 430 may control the data stored in the test cells of the corresponding refresh cycle, to be outputted from the cell array 410 before a next refresh command REF is applied, and may compare outputted data DATA with the test data TEST_DATA.

In the case where the output data DATA and the test data TEST_DATA are the same, the data stored in the test cells is retained without refresh for the refresh cycle of at least 1 time, and, hence, the data retention time of the test cells is equal to or longer than the refresh cycle of at least 1 time. However, in the case where the output data DATA and the test data TEST_DATA are different, the data stored in the test cells is degraded for the refresh cycle of at least 1 time, and hence, the data retention time of at least one memory cell among the test cells is shorter than the refresh cycle of at least 1 time. Therefore, the test circuit 430 may activate a detection signal DET in the case where the output data DATA and the test data TEST_DATA are different, and deactivate the detection signal DET in the case where the output data DATA and the test data TEST_DATA are the same.

The test circuit 430 may control the control block 450 by using a plurality of control signals CONTROLs, thereby, in the test operation, writing the test data TEST_DATA in the cell array 410 and reading the data stored in the test cells, from the cell array 410.

The address storage block 440 latches the period information STEP when the second skip signal SKIP' is activated. Then, the address storage block 440 cannot store the latched period information STEP and latch a next period information STEP if the detection signal DET is deactivated. The address storage block 440 may store the latched period information STEP and latch a next period information STEP if the detection signal DET is activated.

For reference, the period information STEP may be the common address of a word line group which is constructed by word lines as test targets. For example, in the case where the value of the period information STEP is 001, the word line group constructed by the word lines WL16 to WL23 corresponding to the values 001000 to 001111 of the refresh address REF_ADD, of which upper 3 bits are 001, may become a test target, and the period information STEP may correspond to the common address of the word line group.

A stored address may be used to manage weak cells. For example, the memory device may refresh weak cells corresponding to the address stored in the address storage block 440, with a higher frequency than the other memory cells. For example, when normal memory cells are refreshed only once for 1×tRFC, weak cells may be refreshed at least twice for 1×tRFC. By doing this, the data of weak cells may be prevented from being degraded.

The address storage block 440 may output a stored address as a smart refresh address SR_ADD if a smart refresh signal SR is activated. The smart refresh address SR_ADD may be used in refreshing weak cells.

The control block 450 may control the operations of the cell array 410. The control block 450 may control a word line corresponding to the refresh address REF_ADD among the plurality of word lines WL0 to WLx, to be refreshed (i.e., activated and precharged), when the refresh command REF is applied. The control block 450 may receive the plurality of control signals CONTROLs from the test circuit 430, and control the cell array 410 such that test data TEST_DATA is written in test cells. Also, the control block 450 may receive the plurality of control signals CONTROLs from the test circuit 430, and control the cell array 410 such that data DATA stored (or written) in the cell array 410 to be outputted from the cell array 410. For reference, the outputted data DATA may be transferred to the test circuit 430.

The control block 450 may control the cell array 410 to perform an active operation, a read operation and a write operation in addition to the test operation. In FIG. 4, illustration of a configuration and signals for performing the active operation, the read operation and the write operation in addition to the test operation is omitted.

Figure 6:
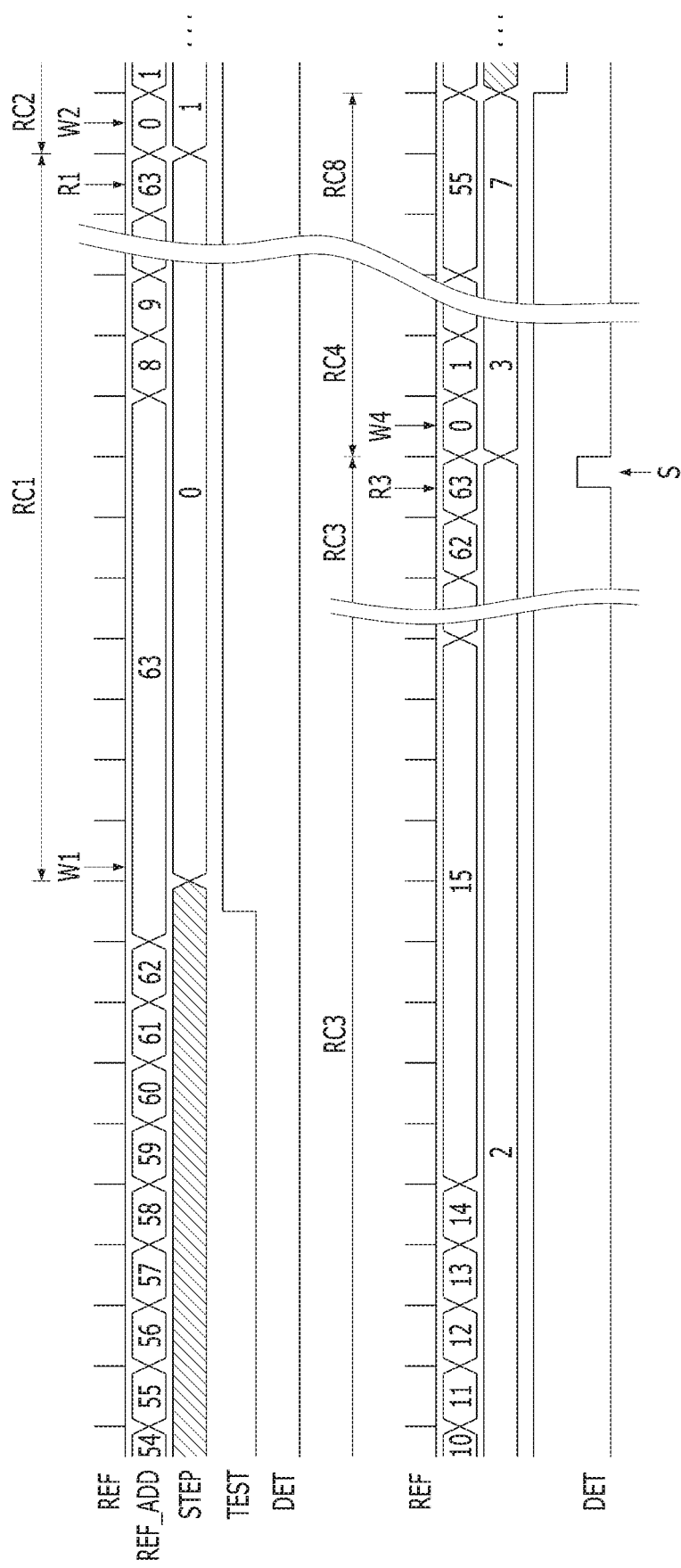
FIG. 6 is a diagram illustrating an exemplary test operation of the memory device shown in FIG. 4.

FIG. 6 is a diagram illustrating an exemplary test operation of the memory device shown in FIG. 4.

With reference to FIG. 6, descriptions will be made for a test operation of the memory device in the case where the period information STEP is changed when the refresh cycle is performed once. The values 000000 to 111111 of the refresh address REF_ADD may be represented as 0 to 63, and the values 000 to 111 of the period information STEP may be represented as 0 to 7. Further, it is assumed that at least one memory cell among memory cells to be coupled to word lines corresponding to refresh addresses REF_ADD having the period information STEP of 2, that is, the refresh addresses REF_ADD of 16 to 23, is a weak cell.

First, in a period in which the test signal TEST is deactivated, a normal refresh operation may be performed. If the test signal TEST is activated, test data may be written in test cells before each refresh cycle is started. If the refresh cycle is ended, the data of the test cells may be read and compared with the test data. As a result of comparing the two data, in the case where the two data are the same, it is determined that a weak cell cannot be included in the test cells. In contrast, in the case where the two data are different, it is determined that a weak cell is included in the test cells.

For example, before a first refresh cycle RC1 is started, test data may be written in test cells, that is, the memory cells coupled to word lines corresponding to the refresh addresses REF_ADD of 0 to 7 (W1). If each refresh cycle is ended, the data of the test cells may be read and compared with the test data (R1). If the detection signal DET is activated after a third refresh cycle RC3 is ended, the period information STEP may be stored in the address storage block 440 as an address corresponding to a word line group including a weak cell (S).

The detection signal DET cannot be activated in the case where a weak cell is not included in the test cells. The detection signal DET is activated when a weak cell is included in the test cells. If the test for all the memory cells, that is, all the address values, is ended, the test signal TEST may be deactivated.

The period of refresh addresses REF_ADD is associated with the number of word lines included in a word line group to be tested at a time. In the above-described example, the values 000000 to 111111 of the refresh addresses REF_ADD are divided into 8 periods. This means that all the word lines are tested by being divided into 8 groups. For example, word lines respectively corresponding to the values of the refresh addresses REF_ADD included in one period may construct one word line group to be tested simultaneously. In the above-described example, word lines WL0 to WL7 are a first group, word lines WL8 to WL15 are a second group, word lines WL16 to WL23 are a third group, word lines WL24 to WL31 are a fourth group, word lines WL32 to WL39 are a fifth group, word lines WL40 to WL47 are a sixth group, word lines WL48 to WL55 are a seventh first group, and word lines WL56 to WL63 are an eighth group. All the word lines constituting each group may be tested together. It is noted, that the number of the word line groups and the number of word lines included in each word line group may be changed depending on a design.

Table 5 represents an example of how the bit number of the period information STEP (or the number of periods) and the number of word lines included in each group are changed, depending on how many groups a plurality of word lines are divided into in a case where the number of word lines is 64 and the refresh address REF_ADD is a 6-bit signal.

TABLE 5

| Number of groups | Bit number of period information (STEP) (number of periods) | Number of word lines included in each group |
| --- | --- | --- |
| 1 | 0 bit (1) | 64 |
| 2 | 1 bit (2) | 32 |
| 4 | 2 bits (4) | 16 |
| 8 | 3 bits (8) | 8 |
| 16 | 4 bits (16) | 4 |
| 32 | 5 bits (32) | 2 |
| 64 | 6 bits (64) | 1 |

As the number of groups is small, a time needed for a test operation is shortened, but, since the number of the word lines included in 1 group increases, the precision of a test may be degraded. Conversely, as the number of groups is large, a time needed for a test operation is lengthened, but, since the number of the word lines included in 1 group decreases, the precision of a test may be improved. In this regard, it is to be appreciated that the precision of a test is associated with the range of word lines to which a weak cell is coupled, when the weak cell is detected.

For example, assuming that the number of groups is 2, in order to test a first group WL0 to WL31 and a second group WL32 to WL63, it is sufficient to perform a refresh cycle 2 times at minimum. In the case where a weak cell is detected from the first group WL0 to WL31, it is possible to know only that a word line having a weak cell is one of the 32 word lines WL0 to WL31, and no further information is available. That is to say, the range of word lines to which a weak cell is likely to be coupled is wide and, hence, the precision of the test is low.

Conversely, assuming that the number of groups is 64, 1 word line constructs 1 group. Thus, in order to test all the groups, it is necessary to perform a refresh cycle 64 times at minimum. In the case where a weak cell is detected from a third group WL2, it is thus possible to precisely know that the word line having the weak cell is the word line WL2. In other words, the range of word lines to which a weak cell is likely to be coupled is narrow and, hence, the precision of the test is high.

Figure 7:
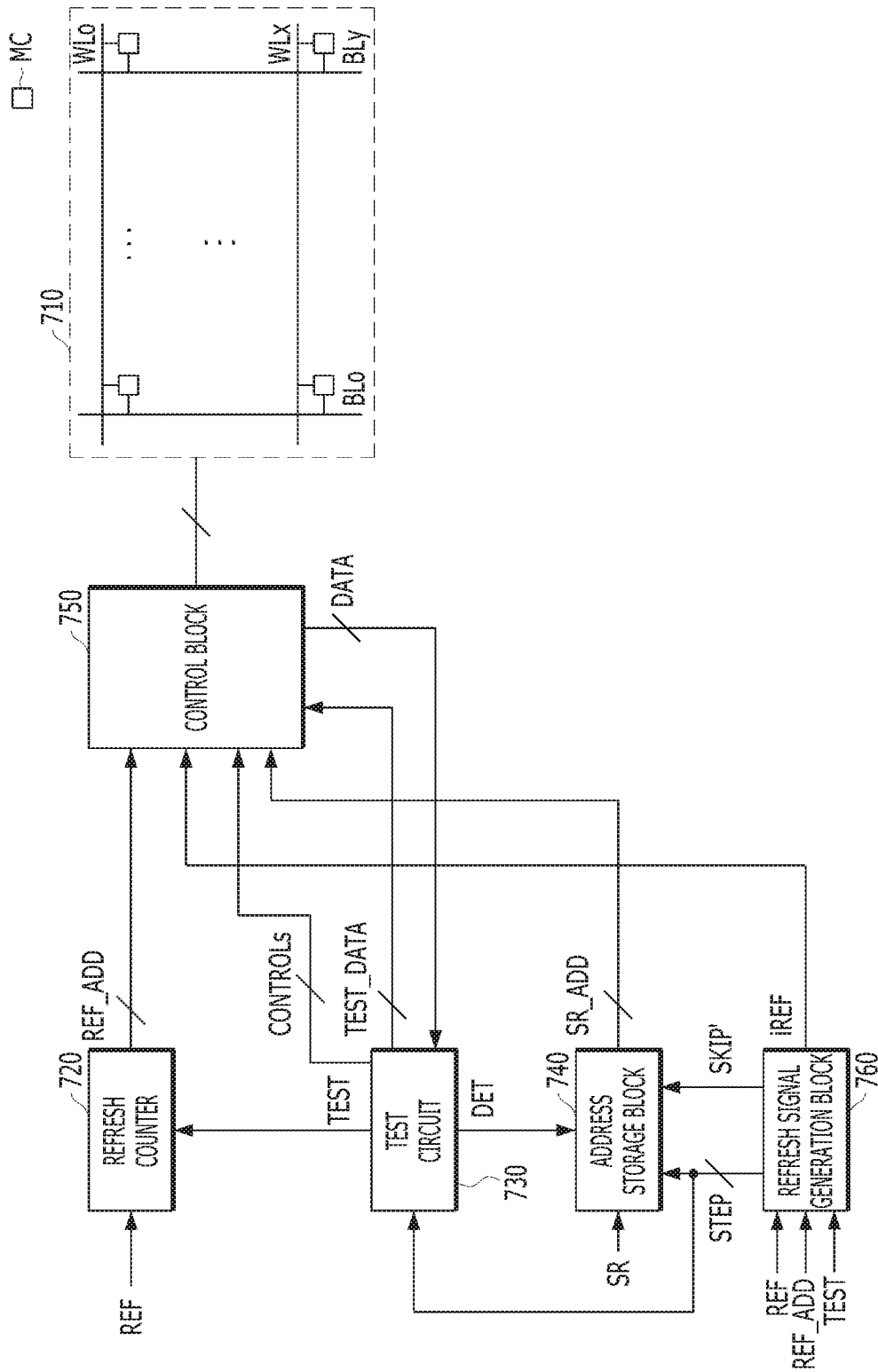
FIG. 7 is a diagram illustrating a memory device in accordance with another embodiment of the present invention.

FIG. 7 is a diagram illustrating a memory device in accordance with another embodiment of the present invention.

Referring to FIG. 7, the memory device may include a cell array 710, a refresh counter 720, a test circuit 730, an address storage block 740, a control block 750, and a refresh signal generation block 760.

The configurations and operations of the cell array 710, the test circuit 730 and the address storage block 740 may be the same as the configurations and operations of the cell array 410, the test circuit 430 and the address storage block 440 of FIG. 4, respectively. The control block 750 may be the same in terms of configuration and operation as the control block 450 except that it performs a refresh in response to an internal refresh signal iREF instead of the refresh command REF.

The refresh counter 720 may perform counting in response to a refresh command REF, and generate a refresh address REF_ADD by using a result thereof. The refresh counter 720 may repeatedly count the refresh address REF_ADD from an initial value to an end value. If the refresh command REF is activated in the state in which the refresh address REF_ADD is the end value, the refresh counter 720 may change the refresh address REF_ADD to the initial value and count again the refresh address REF_ADD from the initial value.

The refresh signal generation block 760 may activate the internal refresh signal iREF in response to the refresh command REF. In the case where the refresh address REF_ADD has at least one predetermined value, that is, in a skip period as aforementioned, the refresh signal generation block 760 may not activate the internal refresh signal iREF even though the refresh command REF is applied. Therefore, in the skip period, while the refresh address REF_ADD is counted continuously, the memory device may not perform a refresh operation even though the refresh command REF is applied.

Figure 8:
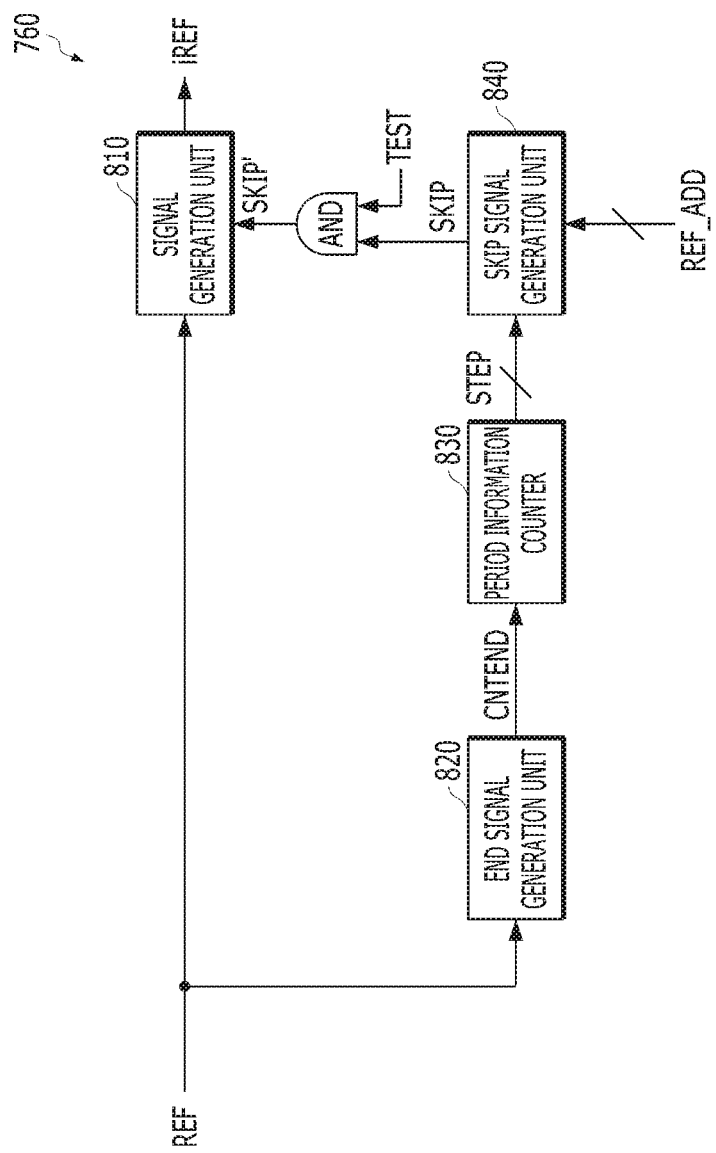
FIG. 8 is a diagram illustrating an exemplary configuration of a refresh signal generation block shown in FIG. 7.

FIG. 8 is a diagram illustrating an exemplary configuration of the refresh signal generation block 760 shown in FIG. 7.

Referring to FIG. 8, the refresh signal generation block 760 may include a signal generation unit 810, an end signal generation unit 820, a period information counter 830, and a skip signal generation unit 840. The configurations and operations of the end signal generation unit 820, the period information counter 830 and the skip signal generation unit 840 may be the same as the configurations and operations of the end signal generation unit 230', the period information counter 240 and the skip signal generation unit 250 of FIG. 5, respectively.

The signal generation unit 810 may activate the internal refresh signal iREF in response to the refresh command REF, and may not activate the internal refresh signal iREF when a second skip signal SKIP' is activated.

Figure 9:
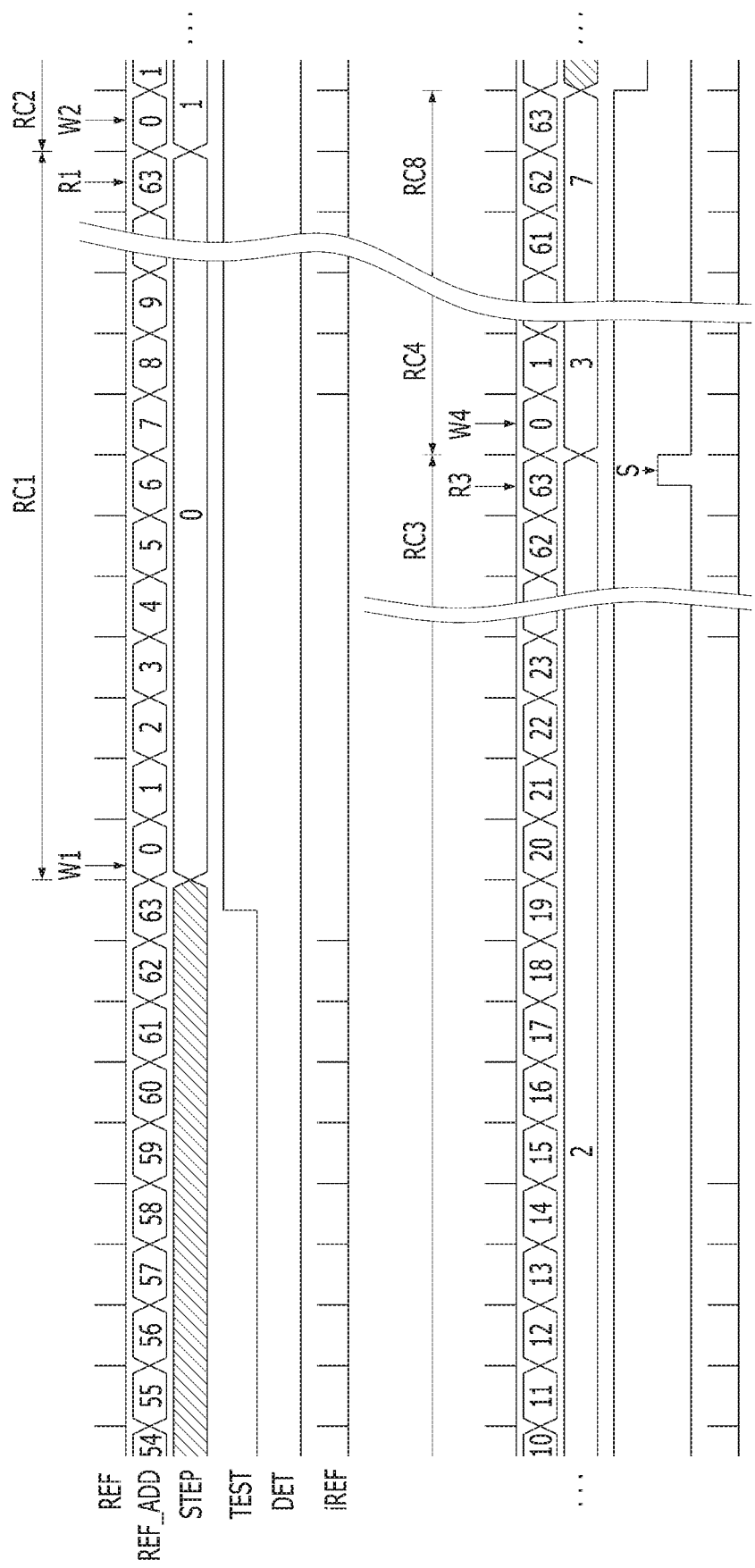
FIG. 9 is a diagram illustrating an exemplary test operation of the memory device shown in FIG. 7.

FIG. 9 is a diagram illustrating an exemplary test operation of the memory device shown in FIG. 7.

Referring to FIG. 9, descriptions will be made for the test operation of the memory device in the case where a period information STEP is changed when a refresh cycle has been performed once. The values 000000 to 111111 of the refresh address REF_ADD may be represented as 0 to 63, and the values 000 to 111 of the period information STEP may be represented as 0 to 7. Further, it is assumed that at least one memory cell among memory cells to be coupled to word lines corresponding to refresh addresses REF_ADD having the period information STEP of 2, that is, the refresh addresses REF_ADD of 16 to 23, is a weak cell.

First, in a period in which a test signal TEST is deactivated, a normal refresh operation may be performed. If the test signal TEST is activated, test data may be written in test cells before each refresh cycle is started. If the refresh cycle is ended, the data of the test cells may be read and compared with the test data. As a result of comparing the two data, in the case where the two data are the same, it is determined that a weak cell is not included in the test cells. In contrast, in the case where the two data are different, it is determined that a weak cell is included in the test cells. In the case of the memory device of FIG. 7, since the internal refresh signal iREF is not activated in response to the refresh command REF in the skip period of each refresh cycle, a refresh operation is not performed in the skip period.

For example, before a first refresh cycle RC1 is started, test data may be written in test cells, that is, the memory cells coupled to word lines corresponding to the refresh addresses REF_ADD 0 to 7 (W1). If each refresh cycle is ended, the data of the test cells may be read and compared with the test data (R1). If a detection signal DET is activated after a third refresh cycle RC3 is ended, the period information STEP may be stored in the address storage block 740 as an address corresponding to a word line group including a weak cell (S).

The detection signal DET is not activated in the case where a weak cell is not included in the test cells. The detection signal DET is activated in the case where a weak cell is included in the test cells. If the test for all memory cells, that is, all address values, is ended, the test signal TEST may be deactivated.

While, in the memory device of FIG. 4, a word line corresponding to the refresh address REF_ADD immediately before a skip period is repeatedly refreshed in the skip period in a test operation, in the memory device of FIG. 7, refresh may not be performed in a skip period in a test operation. The memory device of FIG. 4 and the memory device of FIG. 7 are the same in that the data retention time of test cells is tested by not refreshing a word line corresponding to a predetermined refresh address in a skip period.

In FIGS. 6 and 9, descriptions were made for a test operation in the case where the period information STEP is changed each time a refresh cycle is performed once. A memory cell detected in this case may have a data retention time shorter than 1 refresh cycle. However, by adjusting an interval with which the period information STEP is counted or changing a detection condition, memory cells of various conditions may be detected.

For example, in the above descriptions, by changing the period information STEP each time a refresh cycle is performed 1 time and storing the period information STEP in the case where test data and the data read from test cells are different, it is possible to detect a memory cell having a data retention time shorter than the refresh cycle of 1 time. If the period information STEP is changed each time a refresh cycle is performed 2 times and the period information STEP is stored in the case where test data and the data read from test cells are different, it is possible to detect a memory cell having a data retention time shorter than the refresh cycles of 2 times. Moreover, if the period information STEP is changed each time a refresh cycle is performed 3 times and the period information STEP is stored in the case where test data and the data read from test cells are the same, it is possible to detect a memory cell having a data retention time longer than the refresh cycles of 3 times. In this way, it is possible to detect not only a weak cell having a data retention time shorter than a reference time but also a strong cell having a data retention time longer than the reference time, and the reference time may be changed as the occasion demands.

In the memory devices of FIGS. 4 and 7, by grouping word lines and testing word line groups, it is possible to perform conveniently and quickly a test. A word line group may include one or more word lines. Since the period information STEP corresponds to the addresses of one or more word lines, it may be mentioned that the period information STEP and a word line group as a test unit correspond 1:1.

In the above-described example, it is assumed that the plurality of word lines WL0 to WLx include 64 word lines WL0 to WL63 (that is, x=63) and the addresses of the plurality of word lines WL0 to WL63 are 0 to 63, respectively. When period information STEP is from 0 to 7, word lines as test targets are WL0 to WL7, WL8 to WL15, WL16 to WL23, WL24 to WL31, WL32 to WL39, WL40 to WL47, WL48 to WL55 and WL56 to WL63, respectively. That is to say, in each refresh cycle, 8 word lines may be tested at a time. Also, in the case where the period information STEP is counted for each refresh cycle, a test for the entire word lines may be ended for only 8 refresh cycles.

Figure 10:
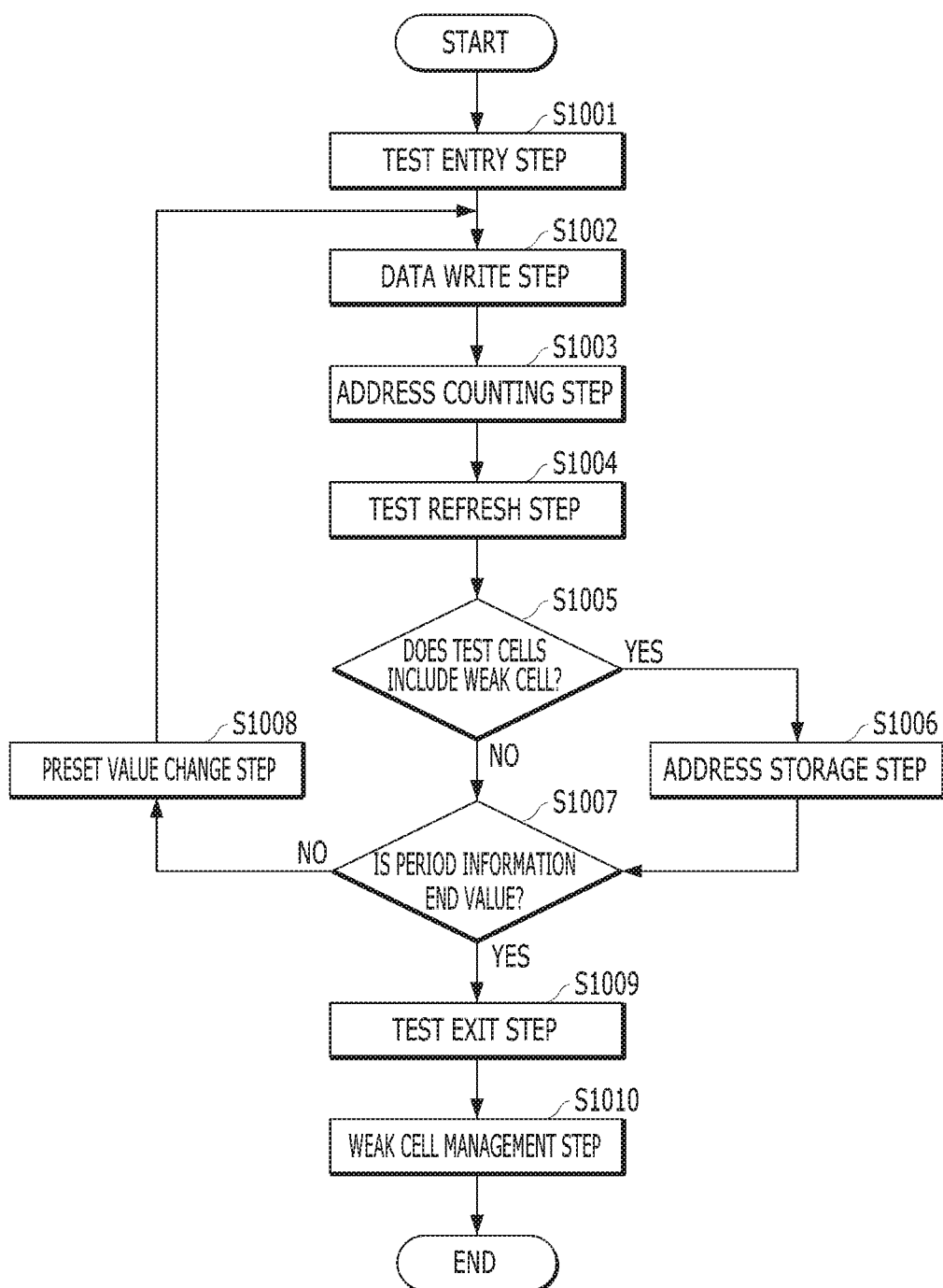
FIG. 10 is a flow chart illustrating a method for operating a memory device in accordance with an embodiment of the present invention.

FIG. 10 is a flow chart illustrating a method for operating a memory device in accordance with an embodiment of the present invention.

Referring to FIG. 10, the method for operating a memory device may include test entry step S1001, data write step S1002, address counting step S1003, test refresh step S1004, detection step S1005, address storage step S1006, check step S1007, preset value change step S1008, test exit step S1009, and weak cell management step S1010.

In the test entry step S1001, entry is made to a test operation. After the test operation is entered, in the data write step S1002, test data TEST_DATA may be written in test cells. In the address counting step S1003, the refresh address REF_ADD is counted, and at least one predetermined value corresponding to the period information STEP may be skipped. In the test refresh step S1004, a word line corresponding to the refresh address REF_ADD is refreshed, and accordingly, test cells corresponding to a skipped refresh address REF_ADD may be skipped in refresh. In the detection step S1005, it is detected whether any of the test cells is a weak cell through comparison of data. In the case where there is no weak cell among the test cells (NO, S1005), the process proceeds to the test exit step S1009 without storage in the address storage step S1006. In the case where a test cell is a weak cell (YES, S1005), the process may proceed to the test exit step S1009 after storing the period information STEP in the address storage step S1006. In step S1007, in the case where the period information STEP is not an end value (NO, S1007), when a refresh cycle is ended, the process proceeds back to the data write step S1002 after the period information STEP is counted in the preset value change step S1008. In the case where the period information STEP is the end value (YES, S1007), the process may proceed to the test exit step S1009 to end a test operation.

After the test is ended, the memory cells coupled to word lines corresponding to the address stored in the address storage block 440, that is, weak cells, may be refreshed with a higher frequency than the other memory cells (corresponding to the weak cell management step S1010).

Figure 11:
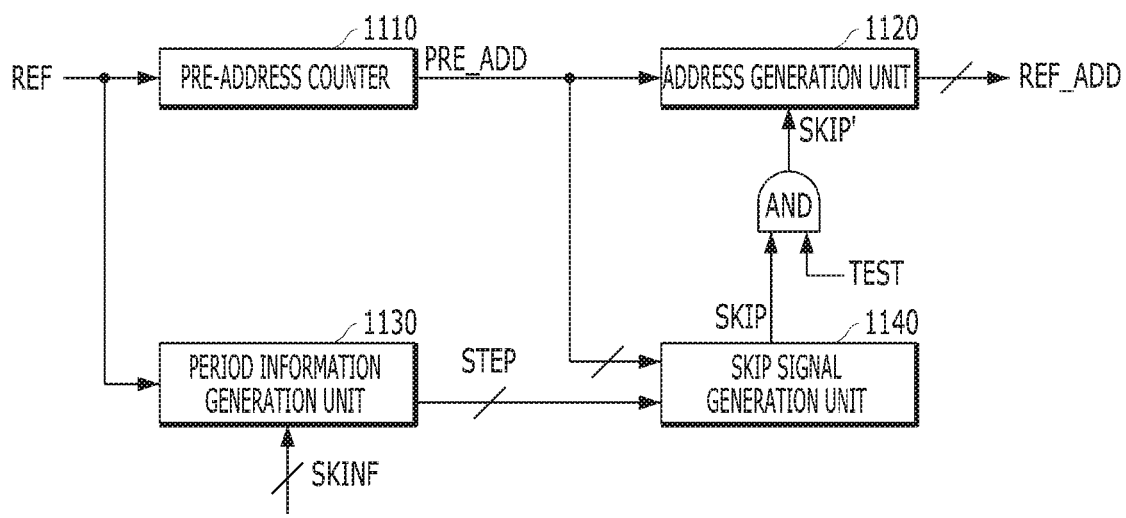
FIG. 11 is a diagram illustrating an address counting circuit in accordance with another embodiment of the present invention.

FIG. 11 is a diagram illustrating an address counting circuit in accordance with another embodiment of the present invention.

Referring to FIG. 11, the address counting circuit may include a pre-address counter 1110, an address generation unit 1120, a period information generation unit 1130, and a skip signal generation unit 1140.

The pre-address counter 1110, the address generation unit 1120 and the skip signal generation unit 1140 of FIG. 11 may operate substantially in the same manner as the pre-address counter 210, the address generation unit 220' and the skip signal generation unit 250 of FIG. 5, respectively.

The period information generation unit 1130 may generate a period information STEP, and count the period information STEP when the counting cycle of the pre-address counter 1110 is ended by the number of times corresponding to a skip information SKINF. For example, if the skip information SKINF has a value corresponding to 1 counting cycle, the period information STEP may be counted each time the counting cycle of the pre-address counter 1110 is ended 1 time. If the skip information SKINF has a value corresponding to 2 counting cycles, the period information STEP may be counted each time the counting cycle of the pre-address counter 1110 is ended 2 times. If the skip information SKINF has a value corresponding to k (where k is a natural number) counting cycles, the period information STEP may be counted each time the counting cycle of the pre-address counter 1110 is ended k times. The skip information SKINF may be a multi-bit signal.

Figure 12:
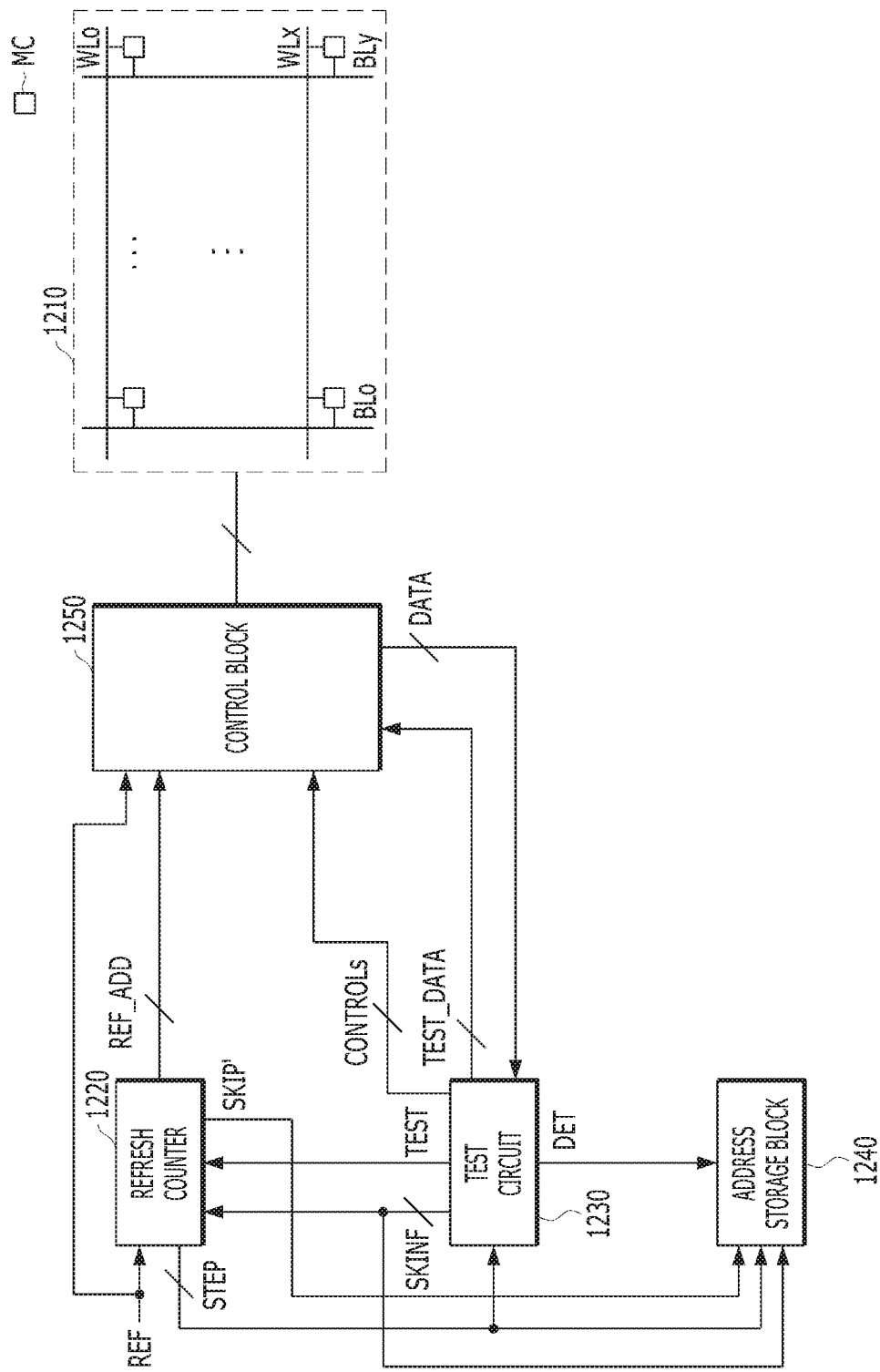
FIG. 12 is a diagram illustrating a memory device in accordance with another embodiment of the present invention.

FIG. 12 is a diagram illustrating a memory device in accordance with another embodiment of the present invention.

Referring to FIG. 12, the memory device may include a cell array 1210, a refresh counter 1220, a test circuit 1230, an address storage block 1240, and a control block 1250. The cell array 1210 and the control block 1250 of FIG. 12 may operate substantially in the same manner as the cell array 410 and the control block 450 of FIG. 4, respectively. The refresh counter 1220 may be the address counting circuit of FIG. 11.

Hereunder, descriptions will be made for a method of storing information on the data retention times of word lines WL0 to WLx by using the address counting circuit of FIG. 11.

In the case where a test signal TEST is deactivated, the refresh counter 1220 does not perform a skip operation, and counts repeatedly a refresh address REF_ADD. In the case where the test signal TEST is activated, the refresh counter 1220 counts repeatedly the refresh address REF_ADD, and may skip at least one predetermined value for at least 1 refresh cycle (or counting cycle) that is determined by a skip information SKINF.

The test circuit 1230 may generate the test signal TEST for activating a test operation, the skip information SKINF, test data TEST_DATA, and a plurality of control signals CONTROLs. The test circuit 1230 may sort a plurality of word line groups according to their data retention time through the test operation.

Hereinbelow, descriptions will be made for the case where the values of the refresh address REF_ADD are divided into 8 periods, that is, the case where a plurality of word lines are tested by being divided into 8 groups. Descriptions may be made for the case where the test circuit 1230 sorts the plurality of word lines into 5 groups depending on a data retention time. The skip information SKINF is a 2-bit signal. When the values of the skip information SKINF are 00, 01, 10 and 11, the refresh address REF_ADD may skip at least one predetermined value for a single refresh cycle, a double refresh cycle (i.e., a refresh cycle performed twice), a triple refresh cycle (i.e., a refresh cycle performed thrice), and a quadruple refresh cycle (i.e., a refresh cycle performed tetrakis), and change the at least one predetermined value. Therefore, in the case where the skip information SKINF has a value of 00, a test may be performed for 8 refresh cycles. In the case where the skip information SKINF has a value of 01, a test may be performed for 16 refresh cycles. In the case where the skip information SKINF has a value of 10, a test may be performed for 24 refresh cycles. In the case where the skip information SKINF has a value of 11, a test may be performed for 32 refresh cycles. The skip information SKINF may be changed in the sequence of 00, 01, 10 and 11.

The address storage block 1240 may latch a period information STEP when a second skip signal SKIP' is activated, and may sort and store the period information STEP depending on the value of the skip information SKINF when a detection signal DET is activated. That is to say, the storage region (not shown in FIG. 12) of the address storage block 1240 may store period information STEP in respective different regions or through sorting when the detection signal DET is activated in the case where the values of the skip information SKINF are 00, 01, 10 and 11. In the case where a period information STEP is already stored when the detection signal DET is activated, the address storage block 1240 may not store the corresponding period information STEP.

Figure 13:
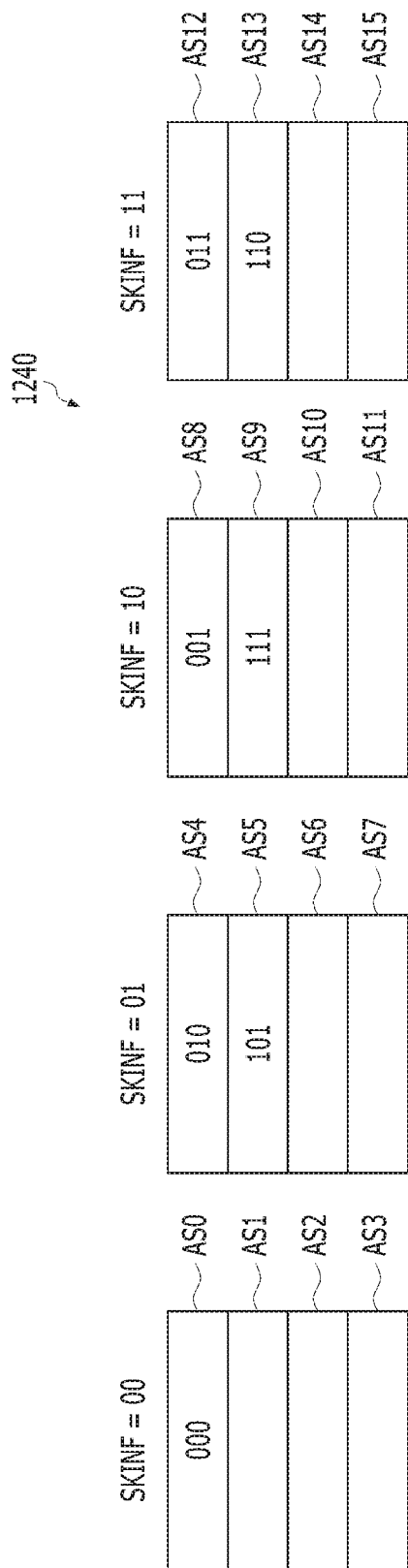
FIG. 13 is a diagram illustrating an example of sorting and storing the addresses of word line groups in an address storage block through a test operation of the memory device shown in FIG. 12.

FIG. 13 is a diagram illustrating an example of sorting and storing period informations STEP, that is, the addresses of word line groups, in the address storage block 1240 through the test operation of the memory device shown in FIG. 12.

Hereinbelow, descriptions will be made for the test operation of the memory device and how period information STEP may be stored in the address storage block 1240, in the case where the memory device includes 64 word lines WL0 to WL63, word line groups are divided into 8 word line groups WL0 to WL7, . . . , WL56 to WL63 and the data retention times of the respective word line groups are as shown in Table 6.

TABLE 6

| Word line group (period information) | Data retention time (refresh cycle basis) |
| --- | --- |
| First word line group (WL0-WL7) (000) | Shorter than 1 refresh cycle |
| Second word line group (WL8-WL15) (001) | Equal to or longer than 2 refresh cycles - shorter than 3 refresh cycles |
| Third word line group (WL16-WL23) (010) | Equal to or longer than 1 refresh cycle - shorter than 2 refresh cycles |
| Fourth word line group (WL24-WL31) (011) | Equal to or longer than 3 refresh cycles - shorter than 4 refresh cycles |
| Fifth word line group (WL32-WL39) (100) | Equal to or longer than 4 refresh cycles |
| Sixth word line group (WL40-WL47) (101) | Equal to or longer than 1 refresh cycle - shorter than 2 refresh cycles |
| Seventh word line group (WL48-WL55) (110) | Equal to or longer than 3 refresh cycles - shorter than 4 refresh cycles |
| Eighth word line group (WL56-WL63) (111) | Equal to or longer than 2 refresh cycles - shorter than 3 refresh cycles |

The address storage block 1240 may include 16 storage regions AS0 to AS15 each of which is able to store 1 address, the 4 storage regions AS0 to AS3 among the 16 storage regions AS0 to AS15 may store the addresses of word line groups of which data retention times are shorter than 1 refresh cycle, the 4 storage regions AS4 to AS7 may store the addresses of word line groups of which data retention times are equal to or longer than 1 refresh cycle and shorter than 2 refresh cycles, the 4 storage regions AS8 to AS11 may store the addresses of word line groups of which data retention times are equal to or longer than 2 refresh cycles and shorter than 3 refresh cycles, and the 4 storage regions AS12 to AS15 may store the addresses of word line groups of which data retention times are equal to or longer than 3 refresh cycles and shorter than 4 refresh cycles.

If the test is started, first, the test may be performed in the state in which the skip information SKINF has a value of 00. In the case where the skip information SKINF has a value of 00, the refresh operation of each test target word line may be skipped by 1 refresh cycle. Therefore, the data retention time of a word line group detected in such a test operation may be shorter than 1 refresh cycle. According to Table 6, the period information STEP of 000 may be detected through such a test and be stored in the storage region AS0.

Next, the test may be performed in the state in which the skip information SKINF has a value of 01. In the case where the skip information SKINF has a value of 01, the refresh operation of each test target word line may be skipped by 2 refresh cycles. Therefore, the data retention time of a word line group detected in such a test operation may be shorter than 2 refresh cycles. The address storage block 1240 may store each of period information STEP not already stored among the period informations STEP detected through such a test, in each storage region of the storage regions AS4 to AS7. According to Table 6, period information STEP of 000, 010 and 101 may be detected through such a test, and the address storage block 1240 may store 010 and 101 not already stored among them, in the storage regions AS4 and AS5, respectively. Therefore, since 010 and 101 are not values detected in the test operation in which the skip information SKINF has a value of 00 but are values detected in the test operation in which the skip information SKINF has a value of 01, the data retention times of word line groups corresponding to them may be equal to or longer than 1 refresh cycle and shorter than 2 refresh cycles.

Next, the test may be performed in the state in which the skip information SKINF has a value of 10. In the case where the skip information SKINF has a value of 10, the refresh operation of each test target word line may be skipped by 3 refresh cycles. Therefore, the data retention time of a word line group detected in such a test operation may be shorter than 3 refresh cycles. The address storage block 1240 may store each of period information STEP not already stored among the period information STEP detected through such a test, in each storage region of the storage regions AS8 to AS11. According to Table 6, period information STEP of 000, 010, 101, 001 and 111 may be detected through such a test, and the address storage block 1240 may store 001 and 111 not already stored among them, in the storage regions AS8 and AS9, respectively. Therefore, since 001 and 111 are not values detected in the test operation in which the skip information SKINF are 00 and 01 but are values detected in the test operation in which the skip information SKINF has a value of 10, the data retention times of word line groups corresponding to them may be equal to or longer than 2 refresh cycles and shorter than 3 refresh cycles.

Next, the test may be performed in the state in which the skip information SKINF has a value of 11. In the case where the skip information SKINF has a value of 11, the refresh operation of each test target word line may be skipped by 4 refresh cycles. Therefore, the data retention time of a word line group detected in such a test operation may be shorter than 4 refresh cycles. The address storage block 1240 may store each of period information STEP not already stored among the period informations STEP detected through such a test, in each storage region of the storage regions AS12 to AS15. According to [Table 6], period information STEP of 000, 010, 101, 001, 111, 011 and 110 may be detected through such a test, and the address storage block 1240 may store 011 and 110 not already stored among them, in the storage regions AS12 and AS13, respectively. Therefore, since 011 and 110 are not values detected in the test operation in which the skip information SKINF are 00, 01 and 10 but are values detected in the test operation in which the skip information SKINF has a value of 11, the data retention times of word line groups corresponding to them may be equal to or longer than 3 refresh cycles and shorter than 4 refresh cycles.

The data retention time of the word line group WL32 to WL39 corresponding to the period information STEP of 100 which is not detected in the test operations may be longer than 4 refresh cycles.

While descriptions were made in the above example for the case where the data retention times of word line groups are divided into 5 groups, it is to be noted that it is possible to divide word line groups into a smaller number of groups or a larger number of groups depending on how to set the skip information SKINF. Also, as described above, the number of the word lines included in one word line group may be adjusted depending on how to set the period information STEP.

The memory device of FIG. 12 may sort word lines or word line groups according to their data retention time, by using the refresh counter 1220 which has a simple configuration. After sorting word lines or word line groups according to their data retention time, the refresh times of the respective word lines or word line groups may be adjusted in consideration of data retention times.

For example, in the case where word line groups have data retention times as in Table 6 as results of the test operations, it may be possible to optimize refresh cycles by word line group by (1) refreshing a word line group having a data retention time shorter than 1 refresh cycle, at least 2 times for 1 refresh cycle, (2) refreshing a word line group having a data retention time equal to or longer than 1 refresh cycle and shorter than 2 refresh cycles, 1 time for 1 refresh cycle, (3) refreshing a word line group having a data retention time equal to or longer than 2 refresh cycles and shorter than 3 refresh cycles, 1 time for 2 refresh cycles, (4) refreshing a word line group having a data retention time equal to or longer than 3 refresh cycles and shorter than 4 refresh cycles, 1 time for 3 refresh cycles and (5) refreshing a word line group having a data retention time equal to or longer than 4 refresh cycles, 1 time for 4 refresh cycles. Through this management, current to be consumed in refresh operations may be minimized, and it is possible to prevent data from being degraded.

In the present technology, by using an address counting circuit which skips predetermined values, it is possible to effectively detect a weak cell in a memory device.

Although various embodiments have been described for illustrative purposes, it will be apparent to those skilled in the art that various changes and modifications may be made without departing from the spirit and scope of the invention as defined in the appended claims.

For example, while descriptions were made in the above example for the case where counting of the addresses ADD, PRE_ADD and REF_ADD represents increasing the addresses ADD, PRE_ADD and REF_ADD 1 by 1, it is to be noted that a counting direction may not be necessarily an increasing direction and a counting interval may not be necessarily 1 and that a counting direction and a counting interval may be changed depending on a design.

What is claimed is:

1. A memory device comprising:
a cell array including a plurality of memory cells;
a refresh counter suitable for counting a refresh address in response to a refresh command;
a refresh signal generation block suitable for activating an internal refresh signal in response to the refresh command, and not activating the internal refresh signal in the case where the refresh address has at least one predetermined value;
a control block suitable for controlling at least one memory cell corresponding to the refresh address among the plurality of memory cells, to be refreshed in response to the internal refresh signal; and
a test circuit suitable for writing test data in a memory cell corresponding to the refresh address having the at least one predetermined value, reading data stored in the memory cell, and comparing the test data with the read data.

2. The memory device according to claim 1, wherein the refresh signal generation block changes the predetermined value when a refresh cycle is performed at least once.

3. The memory device according to claim 1, wherein the refresh signal generation block comprises:
a signal generation unit suitable for activating the internal refresh signal in response to the refresh command, and not activating the internal refresh signal when a skip signal is activated;
an end signal generation unit suitable for activating an end signal when the refresh cycle is performed at least once;
a period information counter suitable for counting a period information when the end signal is activated at least once; and
a skip signal generation unit suitable for activating the skip signal when the period information and a value of at least one preset bit among a plurality of bits included in the refresh address are the same.

4. The memory device according to claim 3,
wherein the refresh counter counts the refresh address from an initial value to an end value, a plurality of values from the initial value to the end value being divided into first to $m^{th}$ (where m is a natural number) periods in each of which divided values are the same in at least one preset bit among the plurality of bits corresponding thereto, and
wherein the period information counter counts the period information from a value corresponding to the first period to a value corresponding to the $m^{th}$ period.

5. The memory device according to claim 1, wherein the test circuit writes the test data in the memory cell, and after the refresh cycle is performed at least once, the test circuit reads the data stored in the memory cell and compares the test data with the read data to detect a data retention time of the memory cell.

6. The memory device according to claim 5, further comprising:
an address storage block suitable for storing an address of a memory cell having a data retention time shorter than a reference time, among the plurality of memory cells.

* * * * *